US010225678B2

(12) United States Patent
Lermer

(10) Patent No.: US 10,225,678 B2
(45) Date of Patent: Mar. 5, 2019

(54) AUDIO SYSTEM, CALIBRATION MODULE, OPERATING METHOD, AND COMPUTER PROGRAM

(71) Applicant: Robert Bosch GmbH, Stuttgart (DE)

(72) Inventor: Franz Lermer, Pilsting-Ganacker (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/565,387

(22) PCT Filed: Apr. 8, 2016

(86) PCT No.: PCT/EP2016/057744
§ 371 (c)(1),
(2) Date: Oct. 9, 2017

(87) PCT Pub. No.: WO2016/166025
PCT Pub. Date: Oct. 20, 2016

(65) Prior Publication Data
US 2018/0124542 A1  May 3, 2018

(30) Foreign Application Priority Data

Apr. 13, 2015  (DE) .................. 10 2015 206 570

(51) Int. Cl.
*H04S 7/00* (2006.01)
*G08B 29/10* (2006.01)
(Continued)

(52) U.S. Cl.
CPC .............. *H04S 7/301* (2013.01); *G08B 29/10* (2013.01); *H04R 29/007* (2013.01); *G01R 31/26* (2013.01)

(58) Field of Classification Search
None
See application file for complete search history.

(56) References Cited

U.S. PATENT DOCUMENTS 5,887,067 A * 3/1999 Costa ................. G08B 3/10
381/81
6,313,744 B1 * 11/2001 Capowski ............. G08B 7/06
340/506
(Continued)

FOREIGN PATENT DOCUMENTS

DE  102010028022  10/2011
DE  202015001656  3/2015
(Continued)

OTHER PUBLICATIONS

Schreiner et al, "Method and measuring device for monitoring loudspeaker systems," WO2008036992, EPO English translation. pp. 1-10.*

(Continued)

*Primary Examiner* — Curtis A Kuntz
*Assistant Examiner* — Qin Zhu
(74) *Attorney, Agent, or Firm* — Michael Best & Friedrich LLP

(57) ABSTRACT

The invention relates to a calibration unit (20) for an audio system (2) having a generator (4) for generating a pilot tone (6), and a detector (16*a-c*) for the pilot tone (6), wherein at least one parameter (P1, 2) determining the pilot tone (6) is changeable, which calibration unit comprises an input unit (22) for optionally setting the parameter (P1, 2), wherein for at least one value (W1, 2) of the parameter (P1, 2), all detectors indicate a detection of the pilot tone (6). An audio system (2) comprises said calibration unit (20). In a method for operating the calibration unit (20), the parameters (p1, 2) is regulated in such a way that all detectors (16*a-c*) indicate a detection of the pilot tone (6). A computer program carries out all steps of the method, when the program is performed on a computer and/or the calibration unit (20) or the audio system (2).

8 Claims, 2 Drawing Sheets

(51) Int. Cl.
    *H04R 29/00*     (2006.01)
    *G01R 31/26*     (2014.01)

(56) References Cited

U.S. PATENT DOCUMENTS

| | | | |
|---|---|---|---|
| 6,798,889 B1 * | 9/2004 | Dicker | H04S 7/301 381/103 |
| 7,103,187 B1 * | 9/2006 | Neuman | H04S 7/301 381/109 |
| 7,953,233 B2 * | 5/2011 | Holloway | H04R 29/006 381/111 |
| 2005/0069153 A1 * | 3/2005 | Hall | H03G 5/025 381/103 |
| 2006/0182288 A1 | 8/2006 | Arcaria et al. | |
| 2014/0126730 A1 * | 5/2014 | Crawley | H04R 29/001 381/59 |
| 2014/0294201 A1 * | 10/2014 | Johnson | H04S 7/301 381/107 |

FOREIGN PATENT DOCUMENTS

| | | |
|---|---|---|
| WO | 2006050754 | 5/2006 |
| WO | 2008036992 | 4/2008 |

OTHER PUBLICATIONS

International Search Report for Application No. PCT/EP2016/057744 dated Jun. 22, 2016 (English Translation, 2 pages).

* cited by examiner

AUDIO SYSTEM, CALIBRATION MODULE, OPERATING METHOD, AND COMPUTER PROGRAM

BACKGROUND OF THE INVENTION

The invention relates to an audio system, a calibration module, an operating method for the audio system and the calibration module, and a computer program.

In many audio systems—particularly in voice alarm installations, but also in other audio systems in which continuous availability and operational security are required—pilot tone monitoring of circuit components, devices and connecting lines is employed. The requirement for the continuous monitoring of audio paths (e.g. in accordance with standard EN54-16) can thus be fulfilled, at least for electronic components.

From WO 2006/050754 A2, which represents the most closely-related instance from the prior art, a loudspeaker tannoy system is known. By means of bidirectional communication between a control device and a monitoring device, the presence and the status of the loudspeaker line and the loudspeaker are monitored on a continuous basis. Communication proceeds by frequency multiplexing on the existing audio line between the audio amplifier and the loudspeaker. In combination with bidirectional data communication, the energy supply for the monitoring devices is extracted from audio frequencies, preferably from a 20 kHz pilot tone, which is generated by the audio amplifier. Filtering prevents any reciprocal effects between audio signals and/or communication systems and/or the energy supply.

SUMMARY OF THE INVENTION

The audio system comprises an audio source device for generating a useful audio signal, an audio target device for the reception of the useful audio signal, and a transmission path for the useful audio signal from the audio source device to the audio target device. The audio system also comprises a generator for the generation of a pilot tone, which is to be transmitted in the direction from the audio source device to the audio target device via the transmission path, and at least one detector for the pilot tone which is connected to the transmission path. The detector has a detector output for a detector signal which is dependent upon the detection of the pilot tone. For the pilot tone—specifically in the generator— at least one of the defining parameters of the pilot tone is adjustable. Specifically, the amplitude of the pilot tone is variable in the first instance. However, the frequency is also adjustable. In the detector, the detection threshold value is moreover adjustable.

The calibration unit incorporates an input unit for optionally setting the parameter wherein, for at least one value of the parameter, the detector signals for all detectors in a known and error-free transmission path indicate the detection of the pilot tone.

The invention is based upon the following considerations: the audio system thus incorporates a pilot tone monitoring function. The pilot tone monitoring function incorporates a pilot tone generator, which is generally present in an audio source device, i.e. an audio source (e.g. an audio controller, intercom unit, etc.). Using a detector, it also incorporates a pilot tone evaluation function in a downstream circuit component or audio device (e.g. an audio amplifier, monitoring unit, etc.), i.e. an audio target device. The term "downstream" signifies that the detector is arranged down-circuit of the generator in the signal path for the useful signal.

Provided that the pilot tone is detected by the pilot tone evaluation function, the audio path, i.e. the transmission path between the generator and the detector, is in order. Immediately the pilot tone is no longer detected by the evaluation function, a fault is signaled in the transmission path. Pilot tone evaluations can be arranged at various points in the transmission path, in order to limit the fault to a specific part of the transmission path. Specifically, these evaluations are also arranged such that the entire relevant transmission path which is available for the useful signal is also monitored.

In this connection, requirements for pilot tone monitoring can include a requirement to the effect that the monitoring function or pilot tone—specifically in addition to and in the absence of the useful audio signal—should be inaudible, and the audio quality of the useful audio signal should not be impaired. Consequently, the pilot tone generator should be set to the lowest possible amplitude and to an appropriate frequency—specifically at the margin of or outside the audible range and/or the output range of the connected loudspeaker.

In many known audio systems, the pilot tone is set to a fixed frequency and a fixed amplitude whereas, in other systems, the parameters can be manually adjusted to the respective situation by the installer during the configuration of the system. The configuration once established cannot be subject to further modification.

A fixed pilot tone setting has a disadvantage, in that the frequency and amplitude must be selected such that pilot tone evaluation will function under all system conditions, e.g. with different amplifications and under different frequency response characteristics. Amplitude and frequency must therefore be on the "safe side", and in consequence are frequently set too high (in the case of amplitude) or too close to the audible range (in the case of frequency). Under certain circumstances (high-quality loudspeaker, or high levels of amplification), the pilot tone thus becomes audible and/or impairs the audio quality of the useful audio signal.

Within the meaning of the invention, the term "optionally" signifies that at any chosen point in time, including during the operation of the audio system, the parameter or the value thereof can be set or reset in a simple manner. Ongoing adjustment to circumstances or changes in the audio system is thus possible in a simple and prompt manner. The pilot tone can thus be adjusted at all times, such that the aforementioned effects are prevented.

The "transmission path", in addition to an actual signal line, includes all other components in the signal path, and thus e.g. intervening audio source or audio target devices, via which the useful signal and the pilot tone are to be routed. "Other components" in the signal path also include audio signal processors, amplifiers, routers, etc. These are not customarily designated as audio source or target devices, and are listed additionally here. A general term for these components is "audio signal processing devices". In the audio system, the pilot tone employs the same path as the useful audio signal.

In the audio system, a plurality of audio source devices and/or audio target devices and/or transmission paths and/or generators can also be present. In principle, a plurality of audio source devices and audio target devices, and thus also a plurality of useful audio signals can be simultaneously present in an audio system. An audio system can also incorporate a plurality of generators. These can be employed for the monitoring of different audio paths, or for the segmental monitoring of an audio path. For each audio source device, a plurality of audio target devices can be present on the same transmission path. A plurality of audio source devices can also be present in the audio system, each with a respective transmission path. The pilot tone is distinct from the useful audio signal. In general, the pilot tone is not only transmitted on one section of the transition path, but over the entire length thereof, specifically from the audio source device to the most remote audio target device and/or to the cable termination of the transmission path. Corresponding detectors are thus located at this point. However, the transmission path can also comprise a plurality of sections, which are separately equipped with a generator and a detector respectively. This arrangement is provided, for example, in the event of a presence of a large number of individual audio components and connecting lines in a single transmission path, in order to permit the more effective isolation of any potential fault source.

Customarily, in the detector, specifically only the amplitude of the pilot tone is evaluated. In some cases, this evaluation is also frequency-dependent. The pilot tone signal is filtered accordingly. Pilot tone monitoring is primarily intended to ensure that, in principle, audio signals can be transmitted. However, upon the setting of the pilot tone, i.e. in the event that the sound condition of the transmission path is known or assumed, the detector signal is employed for the setting of the pilot tone, and thus reflects the fundamental capability of the audio system for the transmission of the pilot tone.

It is also conceivable that the pilot tone is not only, and specifically primarily employed for the monitoring of the loudspeaker line, but is also, and specifically predominantly employed for the supply of energy to the monitoring unit. To this end, too, it is appropriate to employ a—specifically automatic—pilot tone setting according to the invention, e.g. in order to offset voltage drops on the loudspeaker line (e.g. associated with the length and cross-section thereof), and any other influences upon amplitude. Manual setting of amplitude would otherwise be required in this case too.

In a preferred form of embodiment, the detector signal is a binary signal. This signal indicates the detection of a pilot tone on the detector, in that it assumes one of its two states, e.g. is activated. Otherwise, it assumes its second state, e.g. is deactivated. The binary signal thus indicates whether or not a pilot tone is detected. If this signal is for example, activated during normal operation, i.e. in monitoring duty, the transmission path (transmission line, etc.) is fault-free whereas, if it is deactivated, the transmission path is affected by a fault.

According to the invention, by means of the calibration unit, the setting or resetting of the pilot tone can thus be executed at any time, in an optional manner. It is thus possible to set the latter consistently at the lowest possible amplitude, and at the highest or lowest possible frequency, in accordance with the transmission limits of the audio system. Particularly in practice, however, calibration is customarily executed in conjunction with the commissioning of the audio system and/or in conjunction with the regular checking of the installation. Specifically, the calibration unit is not a device, but is a software module.

The invention can be employed in voice alarm systems, other professional audio systems, conference systems and intercom systems, specifically in the field of security technology. The application thereof in other audio installations, e.g. in-car audio systems, is also conceivable.

In a preferred form of embodiment of the invention, the calibration unit comprises an output unit for the output of the detector signal from at least one, and preferably from all of the detectors. In the calibration unit, it can thus also be immediately determined whether, by means of the current parameter settings or pilot tone, all the detectors are actually receiving the pilot tone, and the exceptionally effective exploitation of the aforementioned limits is achieved. The setting of parameters is exceptionally simple, and is possible with no additional auxiliary means.

In a preferred form of embodiment, the calibration unit incorporates a calibration module which acts upon the parameter of at least one, and preferably of all the detectors, which is connected to the respective detector output, and is designed to automatically set the value of the parameter with reference to the detector signal, in accordance with a calibration criterion, such that, in a transmission path which is known to be fault-free, the detector signal indicates the detection of the pilot tone.

The calibration module acts upon parameters, either with the involvement of the input unit or by the circumvention thereof, i.e. without the latter.

This form of embodiment is based upon the following considerations: manual adjustment of the pilot tone monitoring function has a disadvantage, in that this is a time-consuming operation, which thus generates additional costs, and requires good technical knowledge on the part of the installer, together with measuring devices for the verification of functions. This method is moreover susceptible to error, as it is possible that not all system states will be considered.

Conversely, by means of the calibration criterion, it is ensured that, in the event of a known fault-free transmission path between the generator and the detector—i.e. specifically between the audio source device and the audio target device—the pilot tone is detected in the detector.

By means of the proposed automatic calibration of the pilot tone monitoring function, specifically any subsequent differences, deviations, errors etc. in audio systems can be offset automatically: amplitude variations—considered in all cases with respect to the pilot tone present on the detector—associated with circuit tolerances in the individual devices involved, amplitude drops associated with long conductors in the audio transmission paths, amplitude variations associated with differing amplification factors in the various audio amplifier models employed, amplitude drops associated with the parallel connection of a plurality of audio amplifiers on a single controller output, with the consequent higher loading of the audio output on the controller, amplitude variations associated with the employment of the 70V terminal or the 100V terminal on the output of the audio amplifier (3 dB difference in amplitude), different frequency response characteristics e.g. associated with the incorporation of repeater coils in the audio paths, different frequency response characteristics e.g. associated with different sampling rates or with differences in the analog/digital and digital/analog converters employed in digital audio systems, amplitude variations associated with signal processor functions in the signal path, e.g. resulting from compressors, limiters, automatic loudness control functions, etc.

Specifically, further to the installation of an audio system or upon the commissioning thereof, automatic pilot tone calibration is thus initiated. If a plurality of detectors are arranged in a single audio transmission path, this operation can be executed for all the detectors. The audio system can thus be automatically adjusted to the most favorable amplitude and frequency conditions for the respective application, and the pilot tone monitoring function can be independently optimized with respect to inaudibility and audio quality. By means of the automatic calibration method—specifically upon the commissioning of the system—both time and costs are saved, and any spurious adjustments are prevented. The proposed method permits the employment of different audio components in an audio system, as the transmission properties of audio components are automatically compensated with reference to the pilot tone monitoring function. The proposed method permits the employment of various constructional system hardware, as influences associated with long conductors, the parallel connection of audio amplifiers, different amplification factors, the loading of audio outputs, etc. are automatically offset.

According to this form of embodiment of the invention, automatic pilot tone setting is executed in the audio system. Specifically, an automatic and optimized setting of the pilot tone amplitude and the pilot tone frequency is executed, for the purposes of adjustment to the transmission properties of the audio system involving the use of different devices and system configurations.

In a preferred form of embodiment, the calibration criterion is configured such that the calibration module, starting from a predefinable starting value, reduces or increases the value to a limiting value, at which the detector signal still indicates the detection of the pilot tone.

Starting from an established or predefinable base setting (starting value), e.g. the amplitude is thus increased until such time as the pilot evaluation function is actuated (upon the achievement of the limiting value), and the transmission of the pilot tone via the respective audio path has been successfully detected. If a plurality of pilot tone evaluations are available in sequence in a single audio path, the pilot tone amplitude is increased until all the evaluation functions have detected an amplitude which exceeds their respective threshold value. Conversely, it can also occur that, at the base setting established (starting value), the pilot tone is already detected in all the pilot tone evaluations. In this case, the amplitude of the pilot tone is reduced, until the threshold value (limiting value) for the pilot tone evaluation (or one of the plurality of pilot tone evaluations in a single audio path) is undershot. Further to the undershoot of the threshold value, the pilot tone amplitude is increased up to the limiting value, until the secure and continuous detection of the pilot tone by the pilot tone evaluation function is restored.

The frequency of the pilot tone generator is optimized in a similar manner. Thus (from the starting value), the frequency of the generator in the upper audio output range is increased until the limiting frequency of the system is exceeded, thereby resulting in an amplitude drop in the pilot tone evaluation function. Immediately an amplitude drop is detected by evaluation, the frequency of the generator is reset to a previously successfully detected frequency, as a limiting value. Likewise, in the lower audio output range, the generator frequency can be reduced from the starting value, until an amplitude drop is detected by evaluation. Thereafter, the frequency of the generator is also raised again to a previously successfully detected frequency, as a limiting value.

According to this form of embodiment of the invention, amplitude for the pilot tone monitoring of audio paths is thus automatically set to the minimum amplitude required. Frequency for the pilot tone monitoring of audio paths is automatically set to the highest possible frequency, in the upper audio output range or, alternatively, to the lowest possible frequency, in the lower audio output range. By the reduction of the amplitude and the employment of a frequency at the margin of the audio output range, the pilot tone for the monitoring of audio paths is automatically adjusted to the most inaudible setting possible. At the same time, audio quality in the output range is influenced to the least possible extent.

According to one variant of this form of embodiment, the calibration criterion is configured such that the calibration module decreases or increases the value of the parameter by a marginal value from its limiting value, in the direction in which the detector signal securely indicates the detection of the pilot tone.

The direction of "secure" indication is the direction which, from the limiting value, extends counter to the direction in which the pilot tone is no longer detected. It is assumed that the limiting value divides the range of values for the parameter into two localized regions. In the first region, no detection of the pilot tone occurs, while detection occurs in the second region. It is moreover assumed that detection is "more secure", if the value is distanced from the limiting value in the second, i.e. the "detection" region.

By further distancing from the detection limit, the continuous and secure detection of the pilot tone can be achieved, even during the operation of the audio system: Further to the actuation of pilot tone evaluation, the pilot tone amplitude is further increased, and is set a few dBs above the threshold value for evaluation. Correspondingly, frequencies are further increased somewhat from the previously determined lower limit, or decreased from the upper limit, in order to achieve a secure margin from the potential frequency limits. Reserve margins are thus provided with respect to the amplitude and frequency of the pilot tone, in order e.g. to guard against minor variations in the audio system, which would otherwise invalidate pilot tone detection.

In a preferred form of embodiment, the parameter is a frequency or amplitude of the pilot tone. This form of embodiment has already been included in the above description. The amplitude and frequency of the pilot tone can be configured for adjustment in a particularly simple manner.

In the context of the invention, an audio system is also proposed, which incorporates the audio system described above and the calibration unit described above. The properties and advantages of the audio system have already been described in conjunction with the calibration unit according to the invention.

In the context of the invention, a method is also proposed for operating an aforementioned calibration unit or an aforementioned audio system. The parameter is set such that the detector signals of all detectors, in a known fault-free transmission path, indicate the detection of the pilot tone. The properties and advantages of the method have already been described in conjunction with the calibration unit according to the invention.

In a preferred form of embodiment, the method is executed before and/or in conjunction with commissioning and/or during the routine operation of the audio system. In general, the method is not executed prior to commissioning. The audio system must be fully assembled, wired and configured beforehand. However, the input of amplification values, line lengths/impedances etc. in a configuration program is possible, in order to permit simulation and optimization of the pilot tone settings prior to the assembly of the audio system. Specifically, the method is executed again at a later time point, subsequently to commissioning or the first execution, specifically in a repeated cyclical manner. Specifically, a further execution of the method is primarily executed in conjunction with regular inspections of the installation. Cyclic inspections are required under the terms of various standards.

It is thus ensured that the pilot tone is advantageously set, as described above, not only at the start, but also during the subsequent or further operation of the audio system.

In the context of the invention, a computer program with program code means is also proposed, for the execution of all the steps of the aforementioned method, where said program is run on a computer and/or on the aforementioned calibration module, or on the aforementioned audio system. The properties and advantages of the computer program have already been described in conjunction with the calibration unit according to the invention or with the aforementioned method.

BRIEF DESCRIPTION OF THE DRAWINGS

Further characteristics, advantages and effects of the invention proceed from the following description of a preferred exemplary embodiment of the invention, and from the attached figures. Herein, in the form of a schematic sketch.

DETAILED DESCRIPTION

Figure 1:
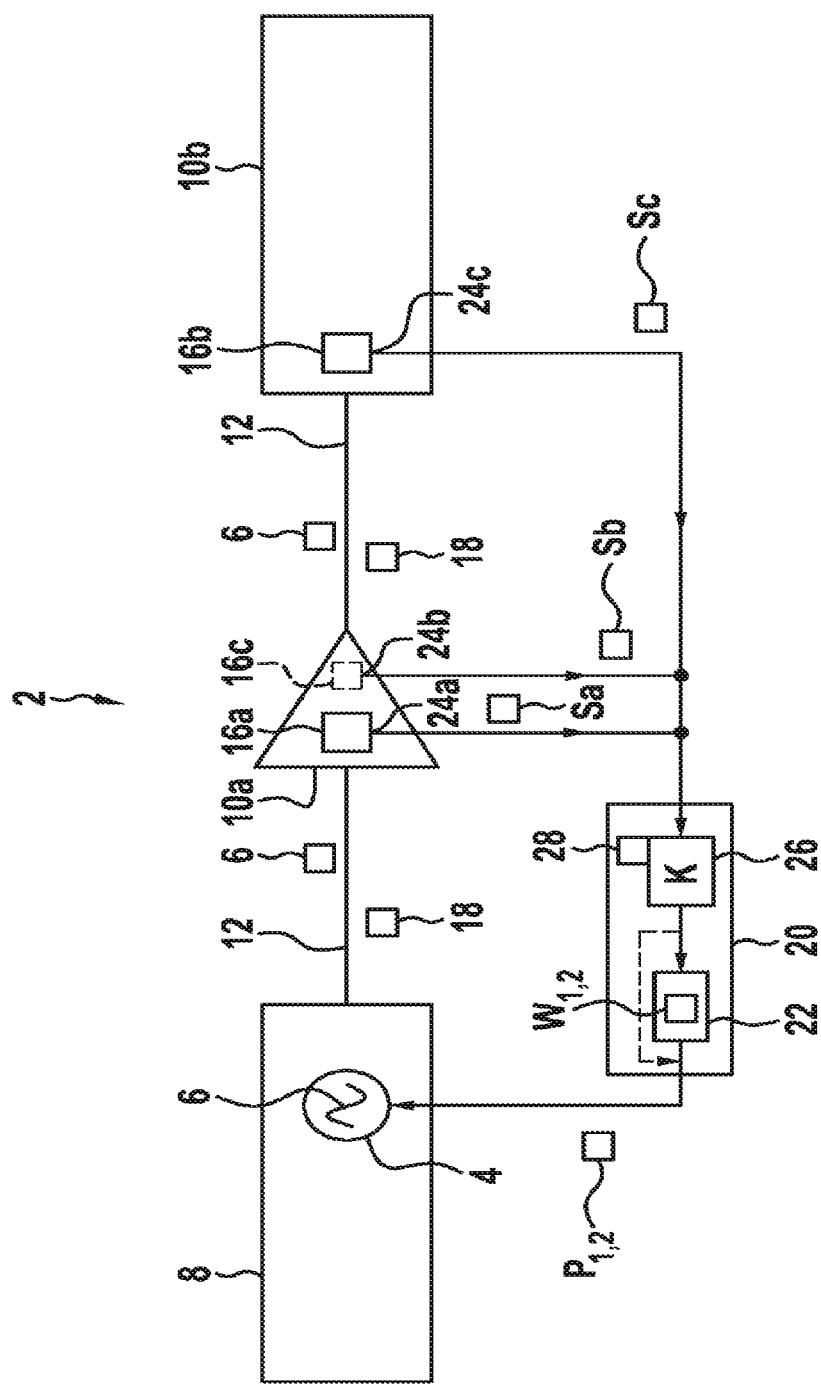
FIG. 1 shows a pilot tone monitoring function in an audio system.

FIG. 1 shows an example of a pilot tone monitoring function in an audio system 2, which is specifically part of a larger audio system. An audio source device 8, in this case an audio controller, generates a useful audio signal 18 in service, which is transmitted via a transmission path 12 (in this case, firstly, a low-frequency audio line) to a first audio target device 10a, in this case to an amplifier arranged down-circuit in the transmission path 12. Alternatively, in a manner not represented, a plurality of audio source devices, audio target devices, transmission paths, generators, detectors, etc. may be present in the audio system 2. In the amplifier, the useful signal 18 is amplified, and is transmitted via the further transmission path 12 (now a 100 V audio line, also designated as a 100 V loudspeaker line, or alternatively a low-resistance loudspeaker line of any desired rating) to a second audio target device 10b, in this case a monitoring unit. Alternatively, the second (or further) target device is a loudspeaker with an integrated monitoring unit. Here, the output of the audio signal is executed by means of an unrepresented loudspeaker. The transmission path 12 also passes through the audio target device 10a.

For the routine control or checking of all the aforementioned components of the audio system 2, a pilot tone monitoring function is provided. The components are all the devices and transmission paths. A generator 4 for a symbolically-represented pilot tone 6 is provided in the audio source device 8. The pilot tone 6 is likewise transmitted via the transmission path 12, either in combination with, or in the absence of the useful signal. An evaluation of the pilot tone 6 is executed in the first audio target device 10a. A further evaluation of the pilot tone 6 is executed in the second audio target device 10b, arranged along the transmission path 12 down-circuit of the audio target device 10a. For segmental monitoring, alternatively, a second pilot tone (generator) is incorporated in the amplifier. The low-frequency audio line and the 100 V audio line are thus monitorable in a separate manner. Monitoring is executed by a respective detector 16a,b in the respective audio target device 10a,b.

Alternatively, two detectors 16a,c for a respective pilot tone evaluating function are incorporated in the audio target device 10a. A first evaluation by means of the detector 16a, at the input, permits the monitoring of the audio path from the audio source device 8 (audio controller) to the audio target device 10a (amplifier). Further monitoring by means of the detector 16c on the amplifier output permits the monitoring of the audio target device 10a itself, i.e. of its constituent amplification stages.

In the generator, two parameters P1,2 of the pilot tone 6, namely the amplitude and the frequency thereof, are variable. A calibration unit 20 incorporates an input unit 22 for the values W1,2 of the parameters P1,2. In practice, the input unit is only required for the manual setting of parameter values, or for the input of starting values. However, starting values could also be fixedly preset in the audio system. Alternatively, the input unit can therefore be omitted, or is only provided optionally.

The detectors 16a-c incorporate the respective detector outputs 24a-c, on which the respective detector signals Sa-c are output. The calibration unit 20 also incorporates an output unit 28 for the indication of the parameters P1, 2, or the values W1,2 thereof. Alternatively or additionally, it is also appropriate if the output unit 28 also indicates the states of the detector signals Sa-c.

The calibration unit 20 incorporates a calibration module 26. This acts upon the parameters S1,2, or the values W1,2 thereof. This is executed either via the input unit 22, or directly on the generator 4 in a bypass arrangement (indicated by a dashed line). The calibration module 26 is moreover connected to the detector outputs 26a-c. The calibration module 26 automatically sets the values of the parameters P1,2 in accordance with a calibration criterion K, with reference to the detector signals Sa-c, such that, in the event of a known fault-free transmission path 12 and a known fault-free audio target device 10a, the detector signal Sa-c indicates the detection of the pilot tone 6.

Figure 2:
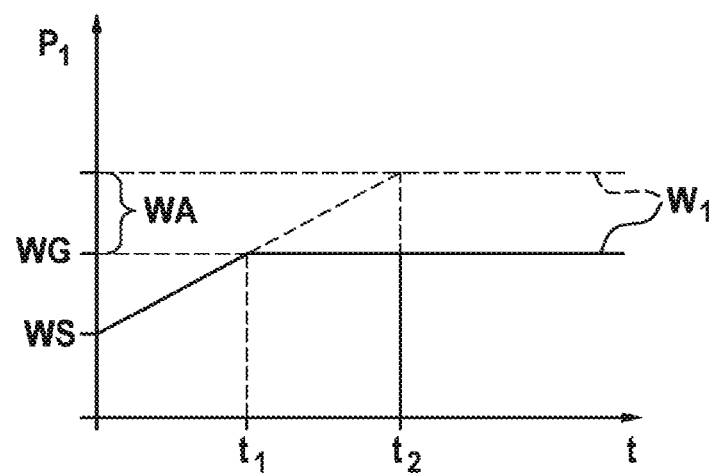
FIG. 2 shows an automatic calibration method for an amplitude of the pilot tone.

FIG. 2 represents an automatic calibration method executed over time t by the calibration module 26. As parameter P1, an amplitude of the pilot tone 6 is initially set to a starting value WS. As not all the detectors 16a-c are, as yet, able to detect the pilot tone 6, as indicated by the detector signals Sa-c, the amplitude is increased. With effect from the limiting value WG, at the time t1, all the detectors 16a-c detect the pilot tone 6. The parameter P1 is therefore maintained at the limiting value WG.

In an alternative variant, further to the detection of the pilot tone 6 by all the detectors 16a-c, the parameter P1 is further increased by a marginal value WA, in order to maintain a "safety margin" with respect to the limit or the limiting value WG. All the detectors 16a-c will now detect the pilot tone 6 securely, even in the event of the deterioration of transmission conditions for the pilot tone 6, i.e. the limiting value WG is further increased. In an unrepresented and converse case, the starting value WS exceeds the limiting value WG. In this case, the generator amplitude is reduced, until the pilot tone is no longer detected by all the detectors 16a-c. Thereafter, the generator amplitude is increased once more, until all the detectors have detected the pilot tone, or the marginal value WA has been achieved.

Figure 3:
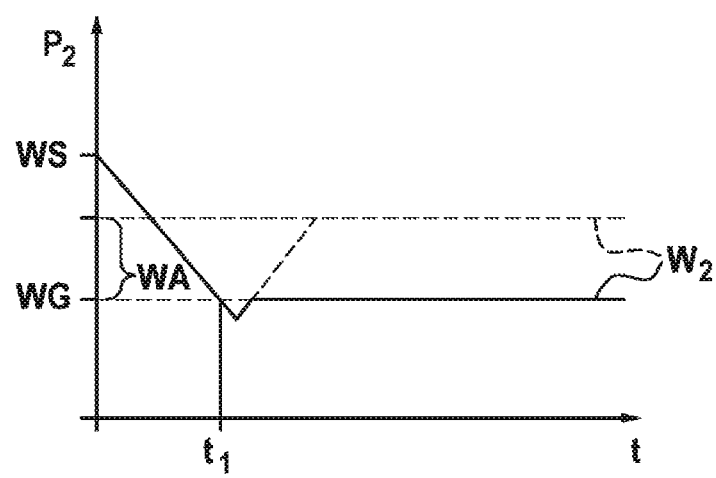
FIG. 3 shows an automatic calibration method for a frequency of the pilot tone.

FIG. 3 represents a further exemplary calibration method executed by the calibration module 26 with respect to parameter P2, namely the frequency of the pilot tone 6. From a starting value WS, at which all the detectors 16a-c already detect the pilot tone 6, this frequency is reduced. With effect from the undershoot of the limiting value WG, not all the detectors 16a-c will continue to detect the pilot tone 6. Consequently, parameter P2 is raised again to the limiting value WG, such that all the detectors 16a-c will again detect the pilot tone 6. Here again, alternatively, the parameter P2 can then be further increased by a "safety margin" by a marginal value WA, as described above, and with the same effect. In an unrepresented alternative example, a corresponding method is applied at high frequencies, at the upper end of the output range: the frequency is increased from a starting value WS, at which all the detectors 16a-c detect the pilot tone 6. With effect from the overshoot of the limiting value WG, not all the detectors 16a-c will continue to detect the pilot tone 6. Consequently, parameter P2 is reduced back down to the limiting value WG, such that all the detectors 16a-c will again detect the pilot tone 6. Here again, alternatively, parameter P2 can be further reduced thereafter by a "safety margin" by a marginal value WA, as described above, and with the same effect.

The invention claimed is:

1. A calibration unit (20) for an audio system (2), wherein the audio system (2) comprises:
   an audio source device (8) for generating a useful audio signal (18),
   an audio target device (10a,b) for the reception of the useful audio signal (18),
   a transmission path (12) for the useful audio signal (18) from the audio source device (8) to the audio target device (10a,b),
   a generator (4) for the generation of a pilot tone (6), which is to be transmitted in the direction from the audio source device (8) to the audio target device (10a,b) via the transmission path (12),
   at least one detector (16a-c) for the pilot tone (6) which is connected to the transmission path (12), having a detector output (24a-c) for a detector signal (Sa-c) which is dependent upon the detection of the pilot tone (6),
   wherein at least one of the defining parameters (P1,2) of the pilot tone (6) is adjustable, and
   the calibration unit (20) incorporates an input unit (22) for optionally setting the parameter (P1,2)
   wherein, for at least one value (W1,2) of the parameter (P1,2), the detector signals (Sa-c) for all detectors (16a-c) in a known and error-free transmission path (12) indicate the detection of the pilot tone (6), and
   a calibration module (26) connected to the detector output (24a-c) and configured to
      act upon the parameters (P1,2) of the at least one detector (16a-c), and
      automatically set the values (W1,2) of the parameters (P1,2) with reference to the detector signal (Sa-c), in accordance with a calibration criterion (K).

2. The calibration unit (20) as claimed in claim 1, further comprising
   an output unit (28) for the output of the detector signal (Sa-c) from at least one of the detectors (16a-c).

3. The calibration unit (20) as claimed in claim 1, wherein the calibration criterion (K) is configured such that the calibration module (26), starting from a predefinable starting value (WS), reduces or increases the value (W1,2) to a limiting value (WG), at which the detector signal (Sa-c) still indicates the detection of the pilot tone (6).

4. The calibration unit (20) as claimed in claim 3, wherein the calibration criterion (K) is configured such that the calibration module (26) decreases or increases the value (W1,2) by a marginal value (WA) from its limiting value (WG), in the direction in which the detector signal (Sa-c) securely indicates the detection of the pilot tone (6).

5. The calibration unit (20) as claimed in claim 1, wherein the parameter (P1,2) is a frequency or amplitude of the pilot tone (6).

6. An audio system (2) comprising:
   an audio source device (8) for generating a useful audio signal (18),
   an audio target device (10a,b) for the reception of the useful audio signal (18),
   a transmission path (12) for the useful audio signal (18) from the audio source device (8) to the audio target device (10a,b),
   a generator (4) for the generation of a pilot tone (6), which is to be transmitted in the direction from the audio source device (8) to the audio target device (10a,b) via the transmission path (12),
   at least one detector (16a-c) for the pilot tone (6) which is connected to the transmission path (12), having a detector output (24a-c) for a detector signal (Sa-c) which is dependent upon the detection of the pilot tone (6),
   wherein at least one of the defining parameters (P1,2) of the pilot tone (6) is adjustable, and
   the calibration unit (20) incorporates an input unit (22) for optionally setting the parameter (P1,2)
   wherein, for at least one value (W1,2) of the parameter (P1,2), the detector signals (Sa-c) for all detectors (16a-c) in a known and error-free transmission path (12) indicate the detection of the pilot tone (6), and
   a calibration module (26) connected to the detector output (24a-c) and configured to
      act upon the parameters (P1,2) of the at least one detector (16a-c), and
      automatically set the values (W1,2) of the parameters (P1,2) with reference to the detector signal (Sa-c), in accordance with a calibration criterion (K).

7. A method for operating a calibration unit (20) in the audio system of claim 1.

8. The method as claimed in claim 7, wherein it is executed before commissioning, in conjunction with commissioning, during the routine operation of the audio system (2), or a combination of the foregoing.

* * * * *